(12) United States Patent
Dobbertin et al.

(10) Patent No.: US 8,400,054 B2
(45) Date of Patent: Mar. 19, 2013

(54) ORGANIC OPTOELECTRONIC COMPONENT

(75) Inventors: Thomas Dobbertin, Regensburg (DE); Markus Heinrich Klein, Tegernheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 12/148,294

(22) Filed: Apr. 16, 2008

(65) Prior Publication Data
US 2008/0315763 A1    Dec. 25, 2008

(30) Foreign Application Priority Data

Apr. 18, 2007  (DE) .................. 10 2007 018 301
May 24, 2007   (DE) .................. 10 2007 024 152

(51) Int. Cl.
*H01L 51/50* (2006.01)
(52) U.S. Cl. ....................... 313/504; 313/498
(58) Field of Classification Search .................. 313/504, 313/498
See application file for complete search history.

(56) References Cited

U.S. PATENT DOCUMENTS

| | | | |
|---|---|---|---|
| 6,284,393 B1 * | 9/2001 | Hosokawa et al. | 428/690 |
| 6,781,305 B1 | 8/2004 | Fujii | |
| 7,071,615 B2 | 7/2006 | Lu et al. | |
| 7,141,924 B2 | 11/2006 | Sung | |
| 7,151,341 B2 | 12/2006 | Pichler et al. | |
| 2002/0036297 A1 | 3/2002 | Pichler | |
| 2004/0046495 A1 * | 3/2004 | Peng | 313/504 |
| 2004/0081855 A1 * | 4/2004 | Kim et al. | 428/690 |
| 2004/0245918 A1 * | 12/2004 | Lee | 313/503 |
| 2005/0007014 A1 | 1/2005 | Kurata | |
| 2005/0077816 A1 * | 4/2005 | Yamada et al. | 313/503 |
| 2006/0214565 A1 * | 9/2006 | Luo et al. | 313/504 |
| 2006/0220534 A1 | 10/2006 | Shibanuma et al. | |
| 2006/0228543 A1 | 10/2006 | Lu et al. | |
| 2006/0240277 A1 * | 10/2006 | Hatwar et al. | 428/690 |
| 2006/0273714 A1 | 12/2006 | Forrest et al. | |

(Continued)

FOREIGN PATENT DOCUMENTS

DE  10 2005 027 961 A1   1/2007
EP       0 914 025 A1    5/1999

(Continued)

OTHER PUBLICATIONS

Fernando de la Vega et al., "71.4 Self Assembled Transparent Conductive Coatings for Flat Panel Displays", Cima Nano Tech SID Digest 2006 (2006).

(Continued)

*Primary Examiner* — Anh Mai
*Assistant Examiner* — Andrew Coughlin
(74) *Attorney, Agent, or Firm* — Cozen O'Connor

(57) ABSTRACT

An organic optoelectronic component comprises a substrate (1) with a first electrode (2) on the substrate (1), at least one first organic layer sequence (31) on the first electrode (2) which is suitable for emitting electromagnetic radiation during operation, an electrically conductive inorganic protective layer (4) on the at least one organic layer sequence (31) and a second electrode (5) on the protective layer (4). At least one of the first and second electrodes (2, 5) has a layer sequence (21, 22, 23) comprising a layer (21) comprising a transparent oxide and a layer (22) comprising a transparent metal.

20 Claims, 3 Drawing Sheets

U.S. PATENT DOCUMENTS

| | | | |
|---|---|---|---|
| 2006/0279190 A1* | 12/2006 | Nakayama | 313/113 |
| 2006/0292362 A1* | 12/2006 | Hsu et al. | 428/323 |
| 2008/0012469 A1* | 1/2008 | Park et al. | 313/500 |
| 2008/0169758 A1* | 7/2008 | Cok | 313/506 |

FOREIGN PATENT DOCUMENTS

| | | |
|---|---|---|
| EP | 1 076 368 A2 | 2/2001 |
| JP | 2000012879 A | 1/2000 |
| JP | 2003073860 A | 3/2003 |
| JP | 2004-139780 | 5/2004 |
| JP | 2006244850 A | 9/2006 |
| JP | 2007053286 A | 3/2007 |
| WO | WO 99/36261 | 7/1999 |
| WO | WO 01/57904 A1 | 8/2001 |
| WO | WO 01/99207 A2 | 12/2001 |
| WO | WO 2004/042108 A2 | 5/2004 |
| WO | WO 2006/134093 A1 | 12/2006 |
| WO | WO 2007/032175 A1 | 3/2007 |

OTHER PUBLICATIONS

G. Gu et al., "Transparent Organic Light Emitting Devices", Applied Physics letters, vol. 68, No. 19, May a6, 1996, pp. 2606-2608.

Parthasarathy, et al., "A Metal-free Cathode for Organic Semiconductor Devices", Applied Physics Letters, vol. 72, No. 17, Apr. 27, 1998, pp. 2138-2140.

H. Murakami et al., "10.5L: Late-News Paper: High Efficiency and High Operational Stability Top-Emitting OLEDs", SID 05 Digest (2005) p. 155.

J. Peltola et al., "Carbon-Nanotube Transparent Electrodes for Flexible Displays", Eikos Corporation, http://222.eikos.com.

\* cited by examiner

ORGANIC OPTOELECTRONIC COMPONENT

RELATED APPLICATIONS

This patent application claims the priority of German patent applications 10 2007 018 301.3 and 10 2007 024 152.8, the disclosure content of which is hereby incorporated by reference.

BACKGROUND OF THE INVENTION

An organic optoelectronic component and a method for producing an organic optoelectronic component are disclosed.

SUMMARY OF THE INVENTION

At least one object of specific embodiments is to specify an organic optoelectronic component which is suitable for emitting electromagnetic radiation. By way of example, illumination or display of information can be made possible as a result. Furthermore, it is an object of specific embodiments to specify a method for producing an organic optoelectronic component.

An organic optoelectronic component in accordance with one embodiment of the invention comprises, in particular,
- a substrate,
- a first electrode on the substrate,
- at least one first organic layer sequence on the first electrode which is suitable for emitting electromagnetic radiation during operation,
- an electrically conductive inorganic protective layer on the at least one organic layer sequence, and
- a second electrode on the inorganic protective layer, wherein
- at least one of the first and second electrodes has a layer sequence comprising a transparent oxide layer (21) and a transparent metal layer.

Thereby, here and hereinafter one layer or one element "on" or "over" another layer or another element can mean that said one layer or one element is arranged directly in direct mechanical and/or electrical contact on the other layer or the other element. Furthermore, it can also mean that said one layer or one element is arranged indirectly on or over the other layer or the other element. In that case, further layers and/or elements are then arranged between said one layer and the other layer.

The first organic layer sequence can be protected against instances of impairment and/or damage by the electrically conductive inorganic protective layer both during operation and, in particular, during the production of the component. Such instances of impairment or damage can occur for example during the production of the organic optoelectronic component. Impairment of or damage to the first organic layer sequence can result for example in a shorter lifetime of the organic optoelectronic component and/or in a lower emission intensity of the electromagnetic radiation generated during operation. In particular, the protective layer can make it possible, for instance, that the second electrode can be applied by means of a method which would impair or even damage the first organic layer sequence without the presence of the inorganic protective layer. By way of example, it may be desirable or necessary for the second electrode or at least part of the second electrode to be applied over the first organic layer sequence by means of a method for sputtering. In the absence of the protective layer, by virtue of the possible bombardment of the organic layer sequence with gas ions and/or the material to be sputtered or the material particles, such a high-energy process could lead to a degradation of the organic layer sequence and thus to a reduced performance and reliability of the organic optoelectronic component. A method for sputtering may be suitable, for instance, for applying and depositing a transparent oxide over the organic layer sequence. Furthermore, metals or metal compounds can also be applied by means of sputtering.

By way of example, the second electrode can comprise a layer sequence having as transparent oxide layer a layer comprising a transparent oxide and as transparent metal layer a layer comprising a metal which is embodied in such a way that it is transparent. By way of example, the metal layer can have such a small thickness that the metal is transparent. As a result, the second electrode can be transparent. In particular, here and hereinafter a "transparent" electrode can mean that at least part of the electromagnetic radiation generated by the organic layer sequence during operation can be emitted through the electrode from the organic layer sequence and thus from the organic optoelectronic component. In other words, the organic optoelectronic component can therefore be suitable for emitting electromagnetic radiation through the second electrode ("top emitter").

As an alternative or in addition, the first electrode can also be transparent, in which case, as an alternative or in addition, the first electrode can have a transparent layer sequence comprising a transparent oxide layer and a transparent metal layer. Furthermore, the substrate can also be transparent. The organic optoelectronic component can therefore be suitable for emitting electromagnetic radiation through the first electrode and the substrate ("bottom emitter"). The substrate can comprise a transparent material, in particular. In this case, the substrate can comprise glass, quartz, plastic, plastic films, metal, metal films, silicon wafers or any other suitable substrate material. In particular, the substrate can also comprise a laminate or a mixture of the abovementioned materials.

Furthermore, "transparent" can also mean that the first and/or the second electrode and/or the substrate are at least partly transmissive to electromagnetic radiation irradiated from the surroundings onto the organic optoelectronic component. If, for instance, the first and the second electrode and also the substrate are transparent, in other words if the organic optoelectronic component is embodied both as a "top emitter" and as a "bottom emitter", the optoelectronic component can be transparent and therefore at least partly transmissive and suitable for emitting electromagnetic radiation from the first organic layer sequence on both sides through the first and the second electrode.

Furthermore, the optoelectronic component can have an encapsulation over the second electrode in order for example to achieve protection against moisture and/or oxidizing substances such as oxygen, for instance, for the electrodes and the first organic layer sequence. In this case, the encapsulation can comprise one or a plurality of layers, wherein the layers of the encapsulation can be for example planarization layers, barrier layers, water and/or oxygen absorbing layers, connecting layers or combinations thereof. The encapsulation can have for example a covering in the form of a cap, in particular a self-supporting cap, and/or a layer or layer sequence on or over the second electrode. Suitable materials can comprise or be for example glass, plastics, metals, metal oxides, non-metal oxides or non-metal nitrides such as, for instance, $SiO_x$ or $SiN_x$, ceramics or combinations thereof. Furthermore, the covering can also be embodied as a laminate. In particular, the encapsulation can be transparent, such that the organic optoelectronic component can also be embodied in transparent fashion with the encapsulation. In addition, a getter material can be applied over the second electrode, for instance, on a side of the encapsulation that faces the electrodes and the organic layer sequence. The getter material used can preferably be an oxidizable material which can react with oxygen and moisture and thereby bind these harmful substances. In particular metals from the group of alkali metals and alkaline earth metals are used as readily oxidizing materials. By way of example, the getter material can comprise magnesium, calcium, barium and/or cesium. Furthermore, other metals such as, for example, aluminum, zirconium, tantalum, and/or titanium, or oxidizable nonmetallic materials can also be suitable. Furthermore, the getter material can comprise materials from the group of zeolites and/or silica gel.

Due to the combination of a transparent metal layer and a transparent oxide layer it is possible to realize a first and/or a second electrode having both good electrical and good optical properties. In this case, "good electrical properties" can mean that the electrode has a low electrical resistance typical of metals and therefore also a good transverse conductivity, that is to say has a high electrical conductivity typical of a metal along the extension direction of the electrode. In particular, through the combination of a transparent metal layer and a transparent oxide layer it is possible to achieve a lower electrical resistance and hence a higher transverse conductivity than for example with a layer composed of a transparent electrically conductive oxide alone. "Good optical properties" can mean, in particular, that the electrode has a high transparency and furthermore a low reflectivity, in particular a lower reflectivity than a layer comprising a transparent metal alone. This can be achieved by virtue of the fact that the transparent oxide layer can act as an antireflection coating. For this purpose, materials having a high refractive index such as, for instance, dielectric oxides, for instance silicon oxide or tantalum oxide, and in particular transparent electrically conductive oxides or mixtures thereof can be suitable. In this case, a high refractive index can be for example a refractive index of greater than or equal to 1.9. By way of example, TCOs can have refractive indices within the range of approximately 1.9 to approximately 2.1. As an alternative or in addition, the first and/or second electrode can also have one or a plurality of layers suitable for antireflection coating and composed of a further material having a high refractive index, for instance from the area of tellurides or sulfides, for instance ZnSe having a refractive index of approximately 2.5. Furthermore, the materials mentioned can also be present in combinations or mixtures in the first and/or second electrode.

Transparent electrically conductive oxides (transparent conductive oxides, "TCO" for short) can be transparent conductive materials, generally metal oxides, such as, for example, zinc oxide, tin oxide, cadmium oxide, titanium oxide, indium oxide, aluminum zinc oxide, indium tin oxide (ITO) and indium zinc oxide. Alongside binary metal-oxygen compounds such as, for example, $ZnO$, $SnO_2$ or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent electrically conductive oxides, are also included in the group of TCOs. Furthermore, the TCOs need not necessarily correspond to a stoichiometric composition and can also be p- or n-doped.

Furthermore, at least one of the first and second electrodes can comprise a layer sequence having a first layer comprising a first transparent electrically conductive oxide (TCO), a second layer comprising a transparent metal and a third layer comprising a second TCO. By virtue of the layer sequence having two layers each comprising a TCO and a layer in between that is embodied as a transparent metal layer, an electrode can be made possible which has a high transverse conductivity owing to the transparent metal layer and a reduced reflectivity owing to the TCO-comprising layers having a high refractive index. For an organic optoelectronic component that is transparent on both sides, that is to say fully transmissive, it is also possible for both electrodes in each case to comprise such a layer sequence. What can thereby be achieved, in particular, is that the two transparent electrodes actually form no optical microresonator, or at least a microresonator having a low quality factor.

In this case, the first TCO and/or the second TCO can comprise one or a plurality of the above-mentioned materials for TCOs. In particular, the first TCO and/or the second TCO can comprise or be composed of ITO, indium zinc oxide, aluminum zinc oxide and/or zinc oxide. Furthermore, the first and/or the second TCO can be doped with aluminum, vanadium and/or gallium or a combination or mixture thereof.

A layer comprising a TCO can be in particular greater than or equal to 5 nm and less than or equal to 150 nm. The transparent metal can comprise aluminum, chromium, molybdenum, nickel, silver, platinum, barium, indium, gold, magnesium, calcium or lithium and compounds, combinations and alloys or consist of one of the stated materials or combinations or alloys thereof. In this case, a layer comprising a transparent metal can have a thickness of greater than or equal to 1 nm and less than or equal to 50 nm, in particular greater than or equal to 20 nm and less than or equal to 40 nm.

In particular, the first electrode and/or the second electrode can be embodied in planar fashion or alternatively in a manner structured into first and/or second electrode partial regions. By way of example, the first electrode can be embodied in the form of first electrode strips arranged parallel alongside one another and the second electrode can be embodied as second electrode strips arranged parallel alongside one another and running perpendicular to said first electrode strips. Overlaps between the first and second electrode strips can therefore be embodied as separately drivable luminous regions. Furthermore, it is also possible for only the first or the second electrode to be structured.

By way of example, the electronic device can be embodied for instance as a structured illumination device or else as a display in an active matrix or passive matrix embodiment for displaying alphanumeric and/or graphical information.

The inorganic electrically conductive protective layer can comprise a transition metal oxide which can comprise or can consist of for example tungsten oxide, vanadium oxide, molybdenum oxide, rhenium oxide, nickel oxide or combinations or mixtures thereof. Furthermore, the inorganic protective layer can also comprise metals such as, for instance, magnesium or silver. In addition to the inorganic protective layer, organic materials such as metallophthalocyanines, for instance, can also be applied. The inorganic protective layer can furthermore have a single layer or a layer sequence composed of a plurality of layers comprising one or more of the materials mentioned and can alternatively or additionally be embodied homogeneously or have a plurality of regions with different mixtures and/or compositions of the abovementioned materials. Furthermore, the protective layer can also be completely or partly intermixed and/or combined with an adjacent organic layer of the first organic layer sequence.

Furthermore, a metal which can be suitable for providing a uniform current for the first organic layer sequence can be applied over or on the protective layer and/or over or on the first or second electrode. By way of example, the metal can be applied in an unstructured uniform layer or a structured layer, for example by sputtering. By way of example, the metal can be structured in meshed fashion. As an alternative or in addition, it is also possible to apply a material comprising carbon nanotubes (CNT) or metallic nanoparticles. In this case, "nanoparticles" can mean, in particular, that the material comprises particles having sizes, that is to say for instance average grain sizes and/or diameters, of greater than or equal to 1 nm and less than or equal to hundreds of nanometers, in particular greater than or equal to 10 nm and less than or equal to 100 nm. In this case, the CNT and/or the metallic nanoparticles can form networks having high electrical conductivity and can be present for example in the form of CNT-based or self-assembling metallic nanocomposites or emulsions thereof and can have an electrical resistivity of less than or equal to 1 to 10 ohms/sq and more than 70% transparency. Layers composed of such materials can be applied by means of printing or spraying methods, for example.

Furthermore, the organic optoelectronic component can have a first organic layer sequence formed as an organic semiconductor layer sequence. In particular, the organic semiconductor layer sequence can be formed with an active region. In this case, the organic optoelectronic component can be embodied in particular as an organic light emitting diode (OLED). In this case, the first organic layer sequence can have a functional region with one or a plurality of functional layers composed of organic materials. In this case, the functional layers can have for example charge carrier transport layers and/or light emitting layers, that is to say, for instance, electron transport layers, electroluminescent layers, hole injection layers and/or hole transport layers. In the functional layers, when a voltage or a current is applied to the first and second electrodes, electromagnetic radiation having a single wavelength or a range of wavelengths can be generated by electron and hole injection and recombination. In this case, an observer can be given a single-colored, a multicolored and/or a mixed-colored luminous impression.

The electron transport layers, hole injection and/or hole transport layers can furthermore be p- and/or n-doped in order to increase the conductivity. By way of example, an electron transport layer can be doped by addition of alkali metal atoms, for instance lithium and/or cesium.

The first organic layer sequence can have in particular at least one p-doped and one n-doped organic layer, between which at least one electroluminescent layer is arranged. In this case, the first electrode can be formed as an anode, while the second electrode can be formed as a cathode. As an alternative, the polarity of the electrodes can also be interchanged.

The first organic layer sequence can comprise as electroluminescent layers for example a white emitting layer sequence. The latter can have for instance yellow to orange and blue to light-blue emitting layers. As an alternative or in addition, a white emitting layer sequence can also have green, blue and red emitting saturated and/or unsaturated layers. As an alternative or in addition, a layer embodied as an electroluminescent layer can comprise one or a plurality of emitter materials for emitting electromagnetic radiation having one or a plurality of different wavelengths, for instance in the yellow and blue or in the green, blue and red spectral range.

The functional layers can comprise organic polymers, organic oligomers, organic monomers, organic small, non-polymeric molecules ("small molecules") or combinations thereof. Furthermore, the functional layers can comprise organic and/or inorganic phosphors and/or wavelength conversion substances.

The organic optoelectronic component can furthermore have a second organic layer sequence suitable for emitting electromagnetic radiation during operation. In this case, the second organic layer sequence can be arranged between the first electrode and the protective layer. In particular, the second organic layer sequence can be arranged in direct contact with the first organic layer sequence, such that the first and the second organic layer sequence are connected in series between the first electrode and the protective layer or the second electrode. In this case, the second organic layer sequence can have one or more of the features presented further above in connection with the first organic layer sequence. In this case, like the first organic layer sequence, the second organic layer sequence can be suitable for giving an observer a single-, mixed- and in particular white-colored luminous impression during operation.

The first and the second organic layer sequence can be connected in series in such a way that an n-doped organic layer of the first organic layer sequence adjoins a p-doped organic layer of the second organic layer sequence, or vice versa. Such a combination of adjacent n- and p-doped layers can also be referred to as a so-called "charge generation layer" (CGL). By forming one or more than one "charge generation layer" directly adjacent to one of the two or to both electrodes, a free setting of the polarity of the electrodes can be made possible without having to interchange the order of the organic layers of the organic layer sequences.

Furthermore, the organic optoelectronic component can have further organic layer sequences, for which the description given in connection with the first and second organic layer sequences can be applicable. The organic optoelectronic component can have for example up to six organic layer sequences which are arranged in the manner described above and are connected up in series with one another. Such an arrangement of organic layer sequences in the form of a vertical stacking can lead to an approximately linear increase in the current efficiency during the generation of light. Consequently, even in the case of an organic optoelectronic component formed in large-area fashion, a high luminous efficiency can be made possible in conjunction with a low current requirement. Therefore, an organic optoelectronic component as described above can be particularly suitable for being formed as a large-area, white-colored illumination device having a luminous area of a plurality of square centimeters or a plurality of square decimeters.

A method for producing an organic optoelectronic component can comprise, in particular, the following steps:
A) providing a substrate,
B) applying a first electrode on the substrate,
C) applying at least one first organic layer sequence on the first electrode,
D) applying an electrically conductive inorganic protective layer on the organic layer sequence,
E) applying a second electrode on the protective layer,
wherein
  step B) and/or step E) comprises the following substeps:
BE1) applying a transparent metal layer, and
BE2) applying a first layer comprising a transparent oxide by means of a cathode sputtering method.

In this case, the first organic layer sequence can be formed in the manner explained further above. In this case, in step C), the functional layers, that is to say the electron and/or hole transport layers and/or electroluminescent layers can be applied for example by means of thermal evaporation, resistive evaporation, printing or spraying methods.

Furthermore, step B) and/or step E) can comprise the following further substep:
BE3) applying a second layer comprising a transparent oxide, wherein the metal layer can be applied between the layers respectively comprising a transparent oxide. In particular, in this case layers respectively comprising a transparent electrically conductive oxide can be applied in substeps BE1) and BE3).

As explained further above, in step D), a transition metal oxide can be applied as protective layer, in particular tungsten oxide, vanadium oxide, molybdenum oxide, rhenium oxide and/or nickel oxide.

In step C), it is also furthermore possible to apply the first organic layer sequence in a substep C1) and a second organic layer sequence in a substep C2). Furthermore, step C) can have further substeps in which, as explained further above, even further organic layer sequences are applied. In particular, in this case, at least one of steps C), C1) and/or C2) can have the following substeps:

Ca) applying a first charge carrier transport layer,
Cb) applying a first organic electroluminescent layer to the first charge carrier transport layer,
Cc) applying a second charge carrier transport layer to the first organic electroluminescent layer.

In this case, the first charge carrier transport layer can be a hole transport layer and the second charge carrier transport layer can be an electron transport layer, or vice versa. The charge carrier transport layers can furthermore be p- or n-doped.

In a further step F), as explained further above, in a further layer carbon nanotubes and/or metallic nanoparticles can be applied on the second electrode. By way of example, this can be done using a screen printing method in which a dispersion composed of CNT and/or metallic nanoparticles is applied spatially selectively in a layer having a thickness of greater than or equal to 30 nm and less than or equal to 200 nm, which is dried at approximately 50° C. during a time duration of approximately 1 minute.

DETAILED DESCRIPTION OF THE DRAWINGS

In the exemplary embodiments and figures, identical or identically acting constituent parts can in each case be provided with the same reference symbols. The elements illustrated and their size relationships among one another should be not regarded as true to scale, in principle, rather individual elements such as, for example, layers, structural parts, components and regions may be illustrated with exaggerated thickness or size dimensions for the sake of better representability and/or in order to afford a better understanding.

Figure 1:
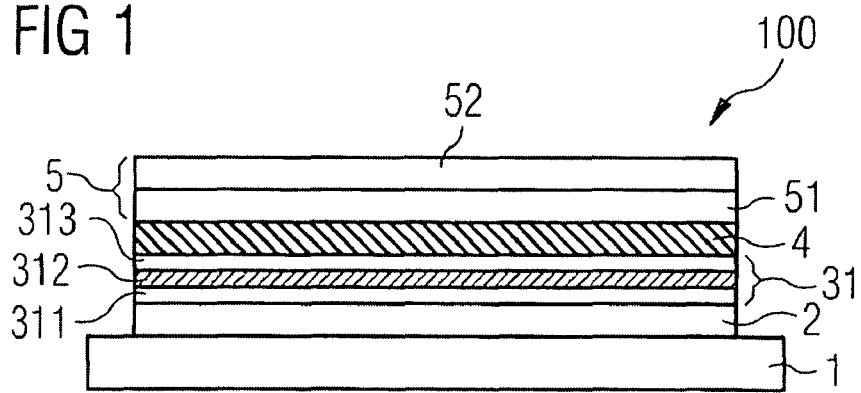
FIGS. 1 to 3 show schematic illustrations of organic optoelectronic components in accordance with some exemplary embodiments in cross section.

FIG. 1 shows an exemplary embodiment of an organic optoelectronic component 100. In this case, a first electrode 2 composed of ITO is applied on a substrate 1, said electrode 2 being embodied as an anode. The substrate 1 comprises glass and is transparent. A first organic layer sequence 31 having functional layers 311, 312, 313 is applied on the first electrode 2. In this case, the layer 311 is embodied as a hole transport layer, while the layer 313 is embodied as an electron transport layer. The layer 312 is embodied as an electroluminescent layer which can emit white-colored electromagnetic radiation during operation. While only one layer 312 is shown in the exemplary embodiment shown, the electroluminescent layer can alternatively also be embodied as a layer sequence having a plurality of electroluminescent layers, as described in the general part.

An inorganic electrically conductive protective layer 4 comprising a transition metal oxide such as, for instance, $WO_3$, $V_2O_5$, $MoO_3$, $Re_2O_7$ or NiO is applied over the organic layer sequence 31. A second electrode 5 is applied over the protective layer 4, said electrode having a first layer 51 and a second layer 52. The first layer 51 is composed of a transparent metal having a layer thickness of between approximately 20 and approximately 40 nm, which is sputtered onto the protective layer 4. The layer 52 composed of a transparent oxide having a layer thickness of between approximately 5 nm and approximately 150 nm is applied over the layer 51. In this case, in the exemplary embodiment shown, the transparent oxide is a TCO, for example ITO, zinc oxide, aluminum zinc oxide or indium zinc oxide. As an alternative, the layers 51 and 52 can also be applied with their arrangement interchanged. In this case, the second electrode 5 is embodied as a cathode. Through the combination of the layer 51 with the layer 52, that is to say the combination of the metal layer with the layer composed of the transparent oxide, it is possible to reduce the reflectivity of the second electrode 5 relative to a transparent metal electrode, such that the electromagnetic radiation generated in the organic layer sequence 31 can be effectively emitted through the second electrode 5.

Since the first electrode 2 consists of a TCO and the substrate 1 is also formed in transparent fashion, the organic optoelectronic component 100 can emit electromagnetic radiation on both sides, that is to say through the second electrode 5 and also through the first electrode 2 and the substrate 1. Furthermore, the organic optoelectronic component 100 thereby appears transparent and transmissive.

Figure 2:
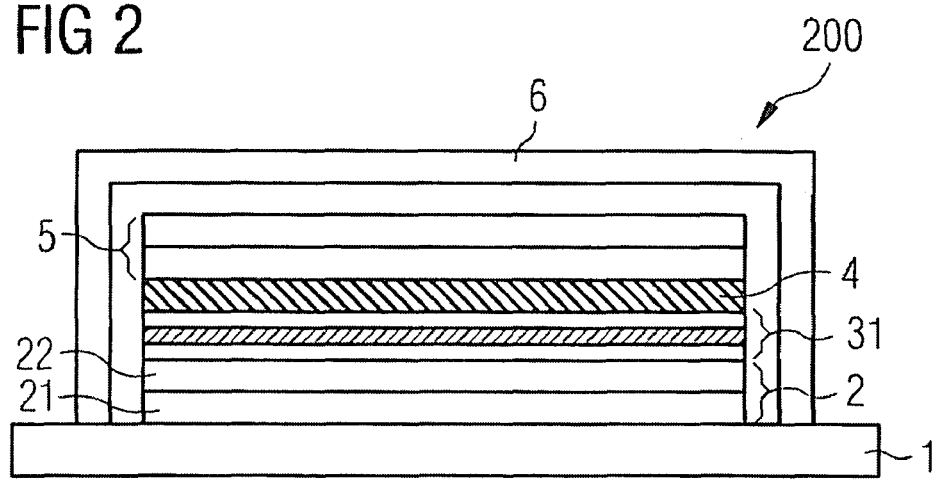

FIG. 2 shows a further exemplary embodiment of an organic optoelectronic component 200, which, in comparison with the organic optoelectronic component 100 of the previous exemplary embodiment, also has a first electrode 2, which comprises two layers 21 and 22. In this case, the layer 21 is embodied from a transparent metal, while the layer 22 is formed from a TCO, for example ITO. As an alternative, the layers 21 and 22 can also be applied with their arrangement interchanged. As already described in connection with the second electrode 5 in the previous exemplary embodiment, the reflectivity of the first electrode 2 can be effectively reduced as a result. As a result, it is possible to prevent an optical microcavity from forming between the electrodes 2 and 5 by virtue of the fact that part of the electromagnetic radiation generated in the first organic layer sequence 31 can be reflected back to the organic layer sequence at the electrodes 2 and 5.

Furthermore, the organic optoelectronic component 200 has an encapsulation 6 in the form of a self-supporting cap, which can protect the electrodes 2 and 5 and also the first organic layer sequence 31 against moisture and oxygen, whereby the lifetime of the organic optoelectronic component 200 can be considerably increased. In this case, the encapsulation 6 is embodied in transparent fashion, for example composed of glass, such that the organic optoelectronic component 200 is still formed in a manner emissive on both sides.

Figure 3:
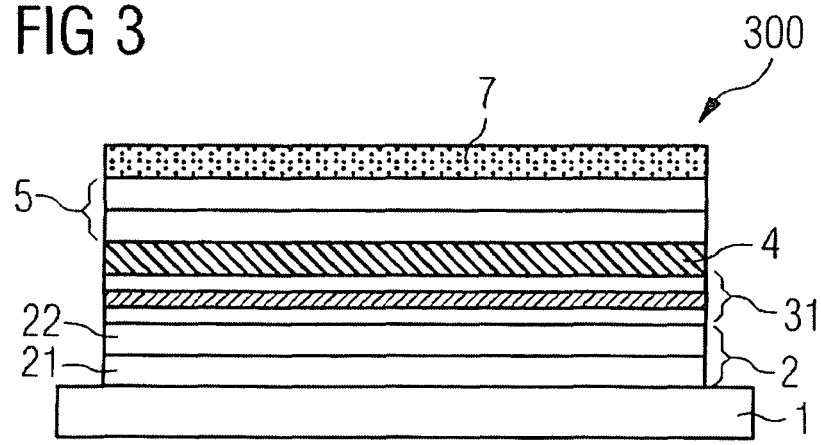

FIG. 3 shows a further exemplary embodiment of an organic optoelectronic component 300, in which a further layer 7 is applied over the second electrode 5, said further layer comprising carbon nanotubes. As a result, the transverse conductivity of the second electrode 5 can be increased, which can result in more homogeneous impressing of the current into the first organic layer sequence 31.

Furthermore, the organic optoelectronic component 300, like the organic optoelectronic component 200, can likewise have an encapsulation.

FIGS. 4A to 4D show a method for producing an organic optoelectronic component 400.

Figure 4A:
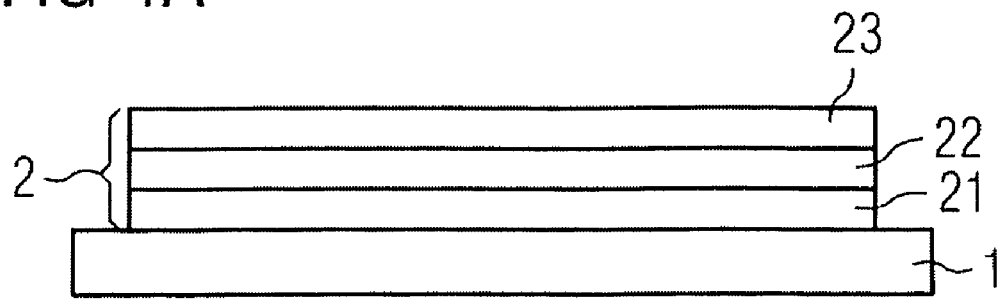
FIGS. 4A to 4D show schematic illustrations of a method for producing an organic optoelectronic component in accordance with a further exemplary embodiment.

In this case, a first method step involves providing a substrate 1, for instance a glass substrate (FIG. 4A). As an alternative or in addition, the substrate 1 can also have for example metal films or plastic films. A first electrode 2, which is embodied in transparent fashion, is deposited onto the substrate 1 by means of sputtering. In this case, the first electrode 2 has a first layer 21 composed of a first TCO, a second layer 22 composed of a transparent metal and a third layer 23 composed of a second TCO. As an alternative to sputtering, it is also possible for at least one layer 21, 22 or 23 to be applied by means of evaporation.

The first and the second TCO comprise for example ITO, indium zinc oxide, or zinc oxide, which can be doped with Al, V or Ga. In this case, the first TCO and the second TCO can be embodied identically or differently. In this case, the layers 21 and 23 have a thickness of between approximately 5 nm and approximately 150 nm. The layer 22 comprises a transparent metal having a thickness of approximately 1 to approximately 50 nm, wherein the metal is Pd, Cu, Al, Cr, Mo, Ni, Ag or Pt or a mixture or alloy thereof. Through the combination of the two TCO layers 21 and 23 with the embedded transparent metal layer 22, it is possible to realize a first electrode 2 having a high electrical conductivity, in particular a high transverse conductivity along the extension direction of the first electrode 2, and also a low reflection coefficient. As a result, the first electrode 2 is formed in highly transparent fashion. By virtue of the fact that the first electrode 2 is deposited on the substrate 1, a step for applying a protective layer prior to applying the first electrode 2 can be obviated.

Figure 4B:
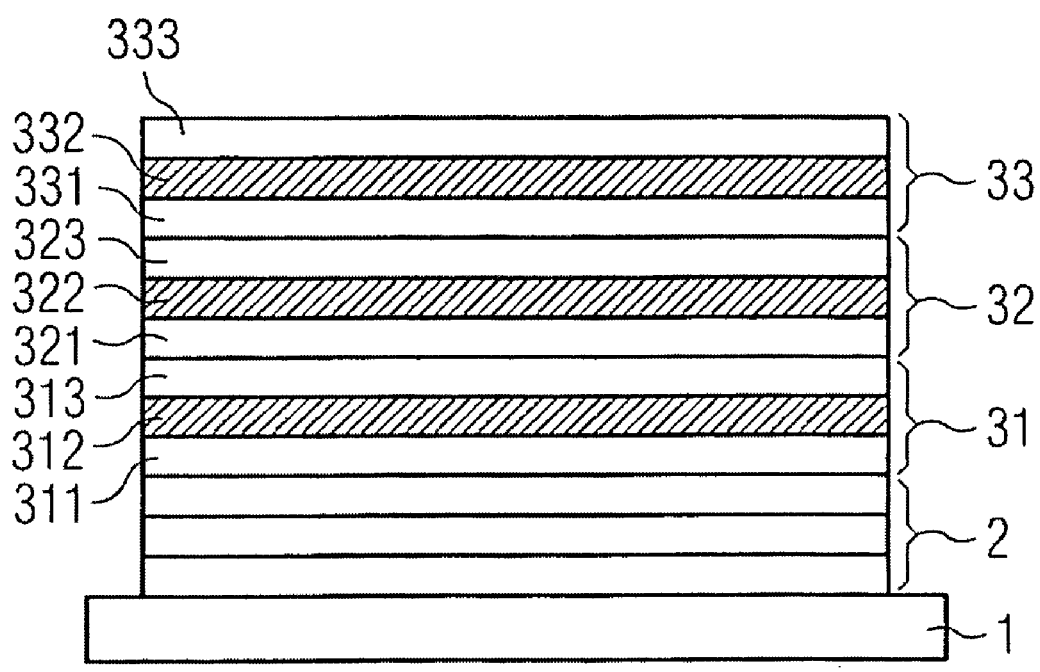

As shown in FIG. 4B, in further method steps, organic layer sequences 31, 32 and 33 are applied over the first electrode 2 by means of thermal or resistive evaporation. In this case, each of the organic layer sequences 31, 32 and 33 respectively has organic functional layers 311, 312, 313, 321, 322, 323, 331, 332, 333, which are embodied as hole transport layers 311, 321, 331, as electron transport layers 313, 323, 333 and respectively in between as electroluminescent layers 312, 322, 332, as described comprehensively in the general part. In order to increase the electrical conductivity, the hole transport layers 311, 321, 331 and the electron transport layers 313, 323, 333 can in each case be doped in order to ensure low operating voltages. In this case, respectively adjacent hole transport layers and electron transport layers form a so-called "charge generation layer". In the exemplary embodiment shown, the electroluminescent layers 312, 322, 332 are in each case embodied identically and in each case emit white-colored electromagnetic radiation during operation. As an alternative, by way of example, the electroluminescent layer 312 can emit red, the electroluminescent layer 312 green and the electroluminescent layer 312 blue electromagnetic radiation, such that, as a result of mixing the different electromagnetic radiations during operation, once again an observer can be given a white-colored luminous impression. In addition, even further identical or other organic layer sequences can be applied on the organic layer sequences 31, 32, 33.

Figure 4C:
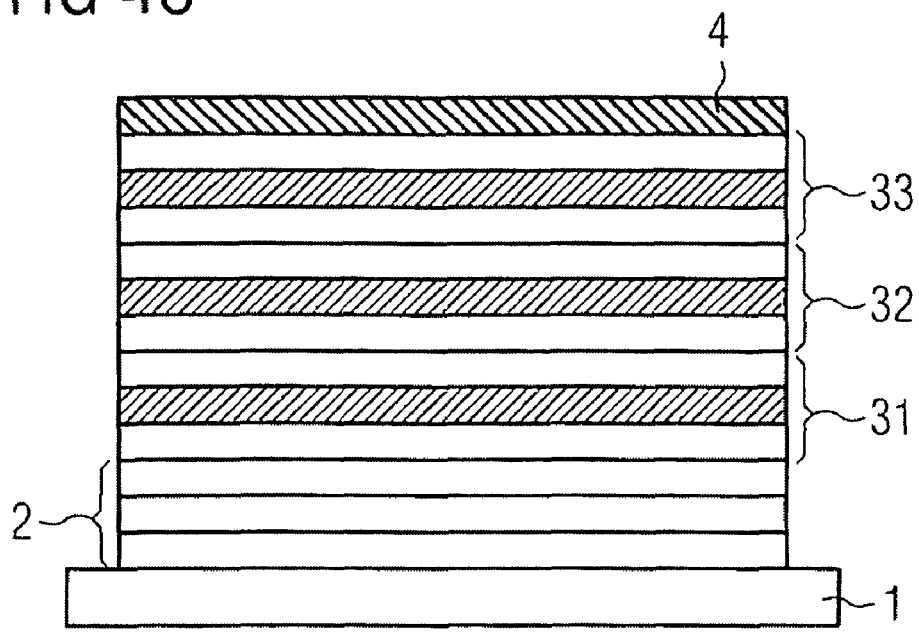
Figure 4D:
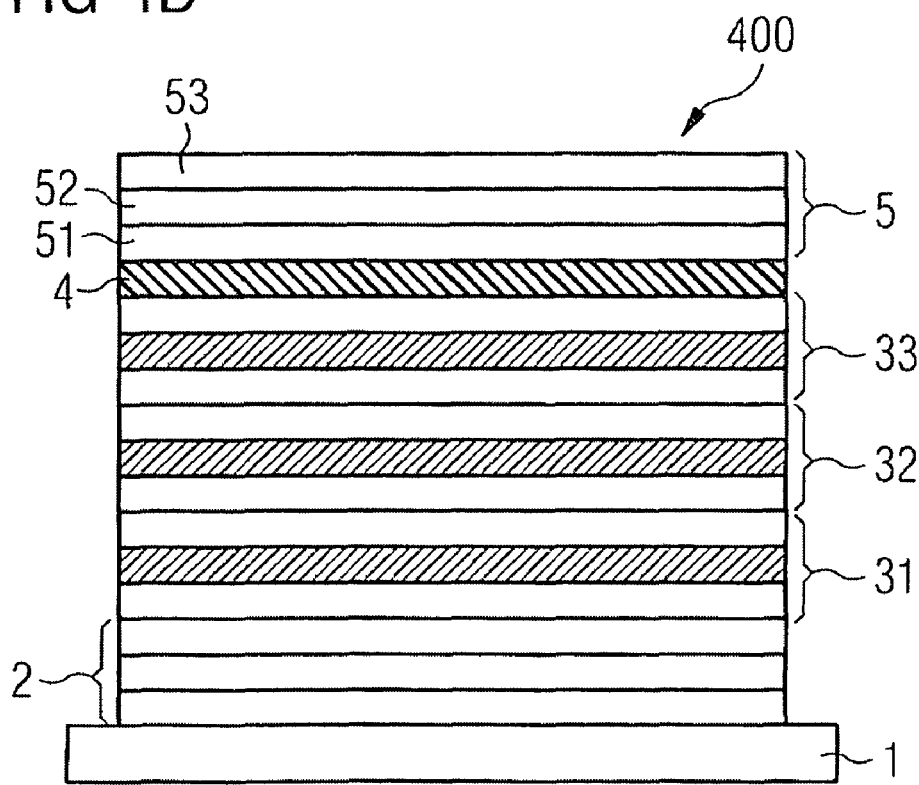

As is shown in FIG. 4C, an inorganic electrically conductive protective layer 4 composed of a transition metal oxide is deposited over the organic layer sequences 31, 32, 33 in a further method step by means of thermal evaporation. In this case, the protective layer 4 has a transition metal oxide, as explained in the general part. As an alternative, the protective layer 4 can also be applied in such a way that it is intermixed with an organic layer in a homogeneous or non-homogeneous, for example structured, manner.

In a further method step, a second electrode 5 is applied on the protective layer 4, said second electrode comprising a first layer 51 composed of a first TCO, a second layer 52 composed of a transparent metal and a third layer 53 composed of a second TCO. In this case, the layers 51, 52, 53 of the second electrode 5 can be embodied in a manner similar to the layers 21, 22, 23 of the first electrode 2 or as described in the general part. By virtue of the fact that the protective layer 4 is applied on the organic layer sequences 31, 32, 33, it is possible to apply the layers 51, 52, 53 by means of sputtering over the organic layer sequences 31, 32, 33 without damaging or impairing the latter.

Furthermore, a layer comprising carbon nanotubes or metallic nanoparticles and also a transparent encapsulation can also be applied to the organic optoelectronic component 400 (not shown here).

The organic optoelectronic component 400 obtainable in this way is distinguished, by virtue of the use of the multilayered electrodes 2, 5 in conjunction with the protective layer 4 and the stacking of the organic layer sequences 31, 32, 33, by a high transparency, a high luminous capacity and by a long lifetime and can in particular also be embodied as a large-area display or illumination device.

The invention is not restricted to the exemplary embodiments by the description on the basis of said exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:

1. An organic optoelectronic component, comprising:
   a substrate;
   a first electrode on the substrate;
   at least one first organic layer sequence on the first electrode for emitting electromagnetic radiation during operation;
   an electrically conductive inorganic protective layer on the at least one organic layer sequence;
   a second electrode on the inorganic protective layer; and
   a material comprising at least one of carbon nanotubes and metallic nanoparticles is applied on the second electrode on a side of the second electrode which is remote from the at least one first organic layer sequence and the electrically conductive protective layer;
   wherein at least one of the first and second electrodes has a layer sequence comprising a transparent oxide layer and a transparent metal layer.

2. The component as claimed in claim 1, wherein the first electrode and the second electrode are transparent to the electromagnetic radiation.

3. The component as claimed in claim 1, wherein the component furthermore has an encapsulation over the second electrode, and the substrate and the encapsulation are transparent.

4. The component as claimed in claim 3, wherein the first and the second electrode each have a layer sequence comprising a transparent oxide layer and a transparent metal layer.

5. The component as claimed in claim 1, wherein at least one of the first and second electrodes comprises a layer sequence having a first layer comprising a first transparent electrically conductive oxide, a second layer comprising a transparent metal and a third layer comprising a second TCO.

6. The component as claimed in claim 5, wherein at least one of the first TCO and the second TCO comprises at least one material selected from the group consisting of indium tin oxide, indium zinc oxide, aluminum zinc oxide and zinc oxide.

7. The component as claimed in claim 6, wherein at least one of the first TCO and the second TCO is doped with at least one of Al, V, and Ga.

8. The component as claimed in claim 1, wherein the transparent metal layer has a thickness of greater than or equal to 1 nm and less than or equal to 50 nm.

9. The component as claimed in claim 1, wherein the inorganic protective layer comprises a transition metal oxide.

10. The component as claimed in claim 9, wherein the inorganic protective layer comprises at least one material from the group consisting of tungsten oxide, vanadium oxide, molybdenum oxide, rhenium oxide and nickel oxide.

11. The component as claimed in claim 1, wherein at least one second organic layer is arranged between the first electrode and the protective layer.

12. The component as claimed in claim 11, wherein the first organic layer sequence and the second organic layer sequence are arranged in direct contact with one another.

13. The component as claimed in claim 1, wherein the at least one first organic layer sequence comprises a p-doped layer, an n-doped organic layer, and an organic electroluminescent layer arranged between the p-doped layer and the n-doped layer.

14. The component as claimed in claim 1, wherein the component is an illumination device emitting a white-colored luminous impression during operation.

15. The component as claimed in claim 1, wherein the at least one of carbon nanotubes and metallic nanoparticles have a size of greater than or equal to 10 nm and less than or equal to 100 nm.

16. The component as claimed in claim 1, wherein the at least one of carbon nanotubes and metallic nanoparticles form networks of high electrical conductivity.

17. The component as claimed in claim 1, wherein the at least one of carbon nanotubes and metallic nanoparticles are in the form of carbon nanotube-based or self-assembling metallic nanocomposites or emulsions thereof.

18. The component as claimed in claim 1, wherein the material comprising the at least one of carbon nanotubes and metallic nanoparticles has an electrical resistivity of less than or equal to 1 ohm/sq and more than 70% transparency.

19. The component as claimed in claim 1, wherein the material comprising the at least one of carbon nanotubes and metallic nanoparticles has an electrical resistivity of less than or equal to 10 ohms/sq and more than 70% transparency.

20. The component as claimed in claim 1, wherein the material comprising the at least one of carbon nanotubes and metallic nanoparticles is applied in the form of a layer on the second electrode.

* * * * *